United States Patent
Fennell et al.

(10) Patent No.: US 6,859,913 B2
(45) Date of Patent: Feb. 22, 2005

(54) REPRESENTING A SIMULATION MODEL USING A HARDWARE CONFIGURATION DATABASE

(75) Inventors: Timothy J. Fennell, Holliston, MA (US); William R. Wheeler, Southborough, MA (US)

(73) Assignee: Intel Corporation, Santa Clara, CA (US)

( * ) Notice: Subject to any disclaimer, the term of this patent is extended or adjusted under 35 U.S.C. 154(b) by 248 days.

(21) Appl. No.: 10/041,753

(22) Filed: Jan. 7, 2002

(65) Prior Publication Data

US 2003/0046641 A1 Mar. 6, 2003

Related U.S. Application Data

(60) Provisional application No. 60/315,852, filed on Aug. 29, 2001.

(51) Int. Cl.⁷ .......................... G06F 17/50; G06F 19/00
(52) U.S. Cl. ............................... 716/4; 716/18; 703/14
(58) Field of Search .......................... 716/4, 18; 703/14

(56) References Cited

U.S. PATENT DOCUMENTS

| | | |
|---|---|---|
| 4,703,435 A | 10/1987 | Darringer et al. |
| 4,970,664 A | 11/1990 | Kaiser et al. |
| 5,128,871 A | 7/1992 | Schmitz |
| 5,212,650 A | 5/1993 | Hooper et al. |
| 5,220,512 A | 6/1993 | Watkins et al. |
| 5,258,919 A | 11/1993 | Yamanouchi et al. |
| 5,267,175 A | 11/1993 | Hooper |
| 5,278,769 A | 1/1994 | Bair et al. |

(List continued on next page.)

FOREIGN PATENT DOCUMENTS

| | | | |
|---|---|---|---|
| EP | 0 404 482 | 12/1990 | ........... G06F/15/60 |
| EP | 0 433 066 | 6/1991 | ........... G06F/15/60 |
| EP | 0 720 233 | 7/1996 | ........... H01L/27/02 |
| EP | 0 901 088 | 3/1999 | ........... G06F/17/50 |
| EP | 1 065 611 | 1/2001 | ........... G06F/17/50 |
| JP | 58-060559 | 4/1983 | ........... H01L/21/82 |
| JP | 03-225523 | 10/1991 | ............ G06F/9/06 |
| JP | 07-049890 | 2/1995 | ........... G06F/17/50 |
| JP | 08-314892 | 11/1996 | ........... G06F/17/00 |
| JP | 2001-068994 | 3/2001 | ......... H03K/19/177 |
| WO | WO 98/37475 | 8/1998 | |
| WO | WO 9855879 A1 * | 12/1998 | ........... G06F/17/50 |
| WO | WO 9939268 A1 * | 8/1999 | ........... G06F/9/445 |
| WO | WO 00/65492 | 11/2000 | ........... G06F/17/50 |

OTHER PUBLICATIONS

Yli–Pietila et al., "The Design and Simulation of Complex Multitechnology Systems", IEEE International Conference on Systems Engineering, Aug. 9, 1990, pp. 474–477.*

Lahti et al., "SADE: a Graphical Toll for VHDL–Based Analysis", 1991 IEEE International Conference on Computer–Aided Design, Nov. 11, 1991, pp. 262–265.*

Gassenfeit, E. H., "Control System Design Realization via VHDL–A: Requirements", Proceedings of the 1996 IEEE International Symposium on Computer–Aided Control System Design, Sep. 15, 1996, pp. 282–285.*

(List continued on next page.)

Primary Examiner—A. M. Thompson
Assistant Examiner—Phallaka Kik
(74) Attorney, Agent, or Firm—Fish & Richardson P.C.

(57) ABSTRACT

A method includes sending a query from graphical user interface to a hardware configuration database. The query requests information located within a simulation model. The hardware configuration database including locations of hardware devices. The hardware devices represent functional processes. The method also includes searching the functional processes to locate the information and directly accessing the information in the simulation model from the graphical user interface without assistance from the hardware configuration database.

24 Claims, 6 Drawing Sheets

U.S. PATENT DOCUMENTS

| | | | |
|---|---|---|---|
| 5,287,289 A | | 2/1994 | Kageyama et al. |
| 5,297,053 A | | 3/1994 | Pease et al. |
| 5,301,318 A | | 4/1994 | Mittal |
| 5,384,710 A | | 1/1995 | Lam et al. |
| 5,475,605 A | | 12/1995 | Lin |
| 5,493,507 A | | 2/1996 | Shinde et al. |
| 5,506,788 A | | 4/1996 | Cheng et al. |
| 5,513,119 A | | 4/1996 | Moore et al. |
| 5,544,067 A | | 8/1996 | Rostoker et al. |
| 5,553,002 A | | 9/1996 | Dangelo et al. |
| 5,568,397 A | | 10/1996 | Yamashita et al. |
| 5,598,347 A | | 1/1997 | Iwasaki |
| 5,603,015 A | | 2/1997 | Kurosawa et al. |
| 5,604,894 A | | 2/1997 | Pickens et al. |
| 5,629,857 A | | 5/1997 | Brennan |
| 5,663,662 A | | 9/1997 | Kurosawa |
| 5,666,289 A | | 9/1997 | Watkins |
| 5,673,198 A | | 9/1997 | Lawman et al. |
| 5,685,006 A | | 11/1997 | Shiraishi |
| 5,694,579 A | | 12/1997 | Razdan et al. |
| 5,706,476 A | | 1/1998 | Giramma |
| 5,717,928 A | | 2/1998 | Campmas et al. |
| 5,724,250 A | | 3/1998 | Kerzman et al. |
| 5,757,655 A | | 5/1998 | Shih et al. |
| 5,809,283 A | * | 9/1998 | Vaidyanathan et al. ........ 703/16 |
| 5,828,581 A | | 10/1998 | Matumura |
| 5,831,869 A | | 11/1998 | Ellis et al. |
| 5,841,663 A | | 11/1998 | Sharma et al. |
| 5,852,564 A | | 12/1998 | King et al. |
| 5,889,677 A | | 3/1999 | Yasuda et al. |
| 5,892,678 A | | 4/1999 | Tokunoh et al. |
| 5,892,682 A | | 4/1999 | Hasley et al. |
| 5,903,469 A | | 5/1999 | Ho |
| 5,933,356 A | | 8/1999 | Rostoker et al. |
| 5,937,190 A | | 8/1999 | Gregory et al. |
| 5,963,724 A | * | 10/1999 | Mantooth et al. ............. 703/14 |
| 5,974,242 A | | 10/1999 | Damarla et al. |
| 6,044,211 A | * | 3/2000 | Jain ............................ 716/18 |
| 6,053,947 A | | 4/2000 | Parson |
| 6,066,179 A | | 5/2000 | Allan |
| 6,077,304 A | * | 6/2000 | Kasuya ......................... 703/14 |
| 6,106,568 A | | 8/2000 | Beausang et al. |
| 6,117,183 A | | 9/2000 | Teranishi et al. |
| 6,120,549 A | | 9/2000 | Goslin et al. |
| 6,132,109 A | | 10/2000 | Gregory et al. |
| 6,135,647 A | | 10/2000 | Balakrishnan et al. |
| 6,152,612 A | * | 11/2000 | Liao et al. .................... 703/23 |
| 6,161,211 A | | 12/2000 | Southgate |
| 6,178,541 B1 | | 1/2001 | Joly et al. |
| 6,205,573 B1 | | 3/2001 | Hasegawa |
| 6,208,954 B1 | * | 3/2001 | Houtchens .................... 703/16 |
| 6,216,256 B1 | | 4/2001 | Inoue et al. |
| 6,219,822 B1 | | 4/2001 | Gristede et al. |
| 6,226,780 B1 | | 5/2001 | Bahra et al. |
| 6,233,540 B1 | | 5/2001 | Schaumont et al. |
| 6,233,723 B1 | | 5/2001 | Pribetich |
| 6,234,658 B1 | | 5/2001 | Houldsworth |
| 6,236,956 B1 | | 5/2001 | Mantooth et al. |
| 6,260,179 B1 | | 7/2001 | Ohsawa et al. |
| 6,272,671 B1 | | 8/2001 | Fakhry |
| 6,275,973 B1 | | 8/2001 | Wein |
| 6,292,931 B1 | | 9/2001 | Dupenloup |
| 6,298,468 B1 | | 10/2001 | Zhen |
| 6,311,309 B1 | | 10/2001 | Southgate ..................... 716/1 |
| 6,324,678 B1 | | 11/2001 | Dangelo et al. |
| 6,327,693 B1 | | 12/2001 | Cheng et al. |
| 6,353,806 B1 | | 3/2002 | Gehlot |
| 6,353,915 B1 | | 3/2002 | Deal et al. |
| 6,360,356 B1 | | 3/2002 | Eng |
| 6,366,874 B1 | | 4/2002 | Lee et al. |
| 6,378,115 B1 | | 4/2002 | Sakurai |
| 6,381,563 B1 | * | 4/2002 | O'Riordan et al. ........... 703/14 |
| 6,381,565 B1 | | 4/2002 | Nakamura |
| 6,401,230 B1 | | 6/2002 | Ahanessians et al. |
| 6,421,816 B1 | | 7/2002 | Ishikura |
| 6,438,729 B1 | | 8/2002 | Ho |
| 6,438,731 B1 | | 8/2002 | Segal |
| 6,440,780 B1 | | 8/2002 | Kimura et al. |
| 6,449,762 B1 | | 9/2002 | McElvain |
| 6,457,164 B1 | | 9/2002 | Hwang et al. |
| 6,473,885 B1 | | 10/2002 | Wallace |
| 6,477,683 B1 | | 11/2002 | Kilhan et al. |
| 6,477,688 B1 | | 11/2002 | Wallace |
| 6,477,689 B1 | | 11/2002 | Mandell et al. |
| 6,480,985 B1 | | 11/2002 | Reynolds et al. |
| 6,487,698 B1 | | 11/2002 | Andreev et al. |
| 6,490,545 B1 | * | 12/2002 | Peng ........................... 703/13 |
| 6,505,328 B1 | | 1/2003 | Van Ginneken et al. |
| 6,505,341 B1 | | 1/2003 | Harris et al. |
| 6,516,456 B1 | | 2/2003 | Garnett et al. |
| 6,519,742 B1 | | 2/2003 | Falk |
| 6,519,755 B1 | | 2/2003 | Anderson |
| 6,523,156 B2 | | 2/2003 | Cirit |
| 6,539,536 B1 | | 3/2003 | Singh et al. |
| RE38,059 E | | 4/2003 | Yano et al. |
| 6,546,528 B1 | | 4/2003 | Sasaki et al. |
| 6,574,787 B1 | | 6/2003 | Anderson |
| 6,591,407 B1 | | 7/2003 | Kaufman et al. |
| 6,704,873 B1 | * | 3/2004 | Underwood ................ 713/201 |
| 6,785,873 B1 | * | 8/2004 | Tseng ............................ 716/4 |
| 2001/0018758 A1 | | 8/2001 | Tanaka et al. |
| 2002/0023256 A1 | | 2/2002 | Seawright |
| 2002/0038447 A1 | | 3/2002 | Kim et al. |
| 2002/0042904 A1 | | 4/2002 | Ito et al. |
| 2002/0046386 A1 | | 4/2002 | Skoll et al. |
| 2002/0049957 A1 | | 4/2002 | Hosano et al. |
| 2002/0059054 A1 | * | 5/2002 | Bade et al. .................... 703/20 |
| 2002/0112221 A1 | | 8/2002 | Ferreri et al. |
| 2002/0138244 A1 | * | 9/2002 | Meyer ......................... 703/14 |
| 2002/0166100 A1 | | 11/2002 | Meding |
| 2003/0004699 A1 | * | 1/2003 | Choi et al. .................... 703/14 |
| 2003/0005396 A1 | | 1/2003 | Chen et al. |
| 2003/0016206 A1 | | 1/2003 | Taitel |
| 2003/0016246 A1 | | 1/2003 | Singh |
| 2003/0036871 A1 | * | 2/2003 | Fuller et al. ................ 702/119 |
| 2003/0177455 A1 | | 9/2003 | Kaufman et al. |
| 2004/0143801 A1 | * | 7/2004 | Waters et al. .................. 716/3 |

OTHER PUBLICATIONS

Lin et al., "A Goal Tree Based High–Level Test Planning System for DSP Real Number Models", 1998 Proceedings of International Test Conference, Oct. 18, 1998, pp. 1000–1009.*

Kutzschebauch, "Efficient logic optimization using regularity extraction", Proceedings of 2000 International Conference on Computer Design, Sep. 17, 2000, pp. 487–493.

Maxfield, C., "Digital Logic Simulation: Event–Driven, Cycle–Based, and Home–Brewed", *Electrical Design News*, 41(14):129–136 (1996).

NB84035598, "Binary Relational Schema to Model Structured LSI Design", IBM Technical Disclosure Bulletin, vol. 26, No. 10B, Mar. 1984, pp. 5598–5601.

NN7807629, "Functional Oriented Symbolic Macromodeling Algorithm", IBM Technical Disclosure Bulletin, vol. 21, No. 2, Jul. 1978, pp. 629–631.

NN8006341, "Macro Physical–To–Logical Checking LSI Chip Design", IBM Technical Disclosure Bulletin, vol. 23, No. 1, Jun. 1980, pp. 341–345.

NN9407481, "Functional Modeling using object Collaboration Diagram", IBM Technical Disclosure Bulletin, vol. 37, No. 7, Jul. 1994, pp. 481–486.

Parlakbilek, et al., "A Multiple–Strength Multiple–Delay Compiled–Code Logic Simulator", *IEEE Transactions on Computer–Aided Design of Integrated Circuits and Systems*, 12(12):1937–1946 (1993).

Su, Stephen, "An Interactive Design Automation System", *Proceedings of the 10th Design Automation Workshop on Design Automation*, pp. 253–261, Jun. 1973.

Foley et al., "An Object Based Graphical User Interface for Power Systems", IEEE Transactions on Power Systems, vol. 8, No. 1, Feb. 1993, pp. 97–104.

Pedram et al., "Floorplanning with Pin assignment", 1990 IEEE International Conference on Computer–Aided Design, Nov. 11, 1990, pp. 98–101.

Renoir, HDL Design Datasheet, Mentor Graphics, 1–8, 1999.

Mentor Graphics Corporation, Renoir™ With HDL2Graphics™, pp. 1–6, 1998, Oregon.

Mentor Graphics Corporation, Renoir HDL Design Datasheet, pp. 1–2, 1999, Oregon.

Computer Design, "After Hard Knocks, Cycle–Based Simulators Stand Their Ground", http://www.computer–design.com/Editorial/1996/10/ASIC/after.html, accessed on Aug. 23, 2001, pp. 1–5.

* cited by examiner

DEF_CLOCK( K_CORE_CLK, clk );

DEF_USTORE( 312.ram_ustore, ustore );

DEF_ARRAY( 312.TE_GPR_AREG_FILE, gpr_a_regs );

FIG. 4A

DEF_CLOCK( K_CORE_CLK, clk );

DEF_USTORE( 314.ram_ustore, ustore );

DEF_ARRAY( 314.TE_GPR_AREG_FILE, gpr_a_regs );

FIG. 4B

```
S_hw_config_chip *chip = new S_hw_config_chip( m_sim, this );
m_sim->m_hw_config_root->link_chip( chip );

S_hw_config_hw_unit *group = new S_hw_config_hw_unit();
chip->link_subunit( group );

S_hw_config_useq *useq = new S_hw_config_useq_fbox();
group->link_subunit( useq );

useq->associate_ustore( ustore, S_CONFIG_ARRAY__ME_USTORE );
useq->associate_array( gpr_a_regs, S_CONFIG_ARRAY__GPR_A );
```

FIG. 5

```
S_hw_config_chip *chip;

S_hw_config_hw_unit *subunit, *subunit_lower;

S_hw_config_sim *root;

S_hw_config_array *array;

int matches;

root = S_sim::getsim()->m_hw_config_root;

chip = root->m_chip_table[0];

subunit = chip->m_subunit_table[0];

root->find_unique_array( S_CONFIG_ARRAY__ME_USTORE,
&matches );

root->find_unique_array( S_CONFIG_ARRAY__GPR_A,
&matches );
```

FIG. 6

REPRESENTING A SIMULATION MODEL USING A HARDWARE CONFIGURATION DATABASE

CROSS-REFERENCE TO RELATED APPLICATIONS

This application is based on, and claims priority from, U.S. Provisional Application Ser. No. 60/315,852, filed Aug. 29, 2001.

BACKGROUND

The present invention relates to representing a simulation model of an integrated circuit (chip).

A simulator employs a processor chip model to provide detailed processor chip emulation to allow a user to create system designs using the chip. The simulator model represents the processor chip and provides the user with detailed system electrical responses of the processor chip within the system. The simulated behavior allows the user to verify the predicted responses of the system implementation using the processor chip.

A graphical user interface (GUI) can allow users to write microcode, which is translated into simulator commands. The GUI can also provide visual indications of processor chip responses. Users can develop microcode for use with designs before the design is fabricated, providing a head start for microcode development efforts.

BRIEF DESCRIPTION OF THE DRAWINGS

FIGS. 4A and 4B are an example of file header information used by the hardware configuration database for the single- and dual-processors, respectively, of FIG. 3.

FIG. 5. is an example of hardware configuration database code to set up access to the control store and the register for both single- and dual-processors of FIG. 3.

FIG. 6 is an example of GUI code used to access the control store and register for both single- and dual-processors of FIG. 3.

DETAILED DESCRIPTION

Figure 1:
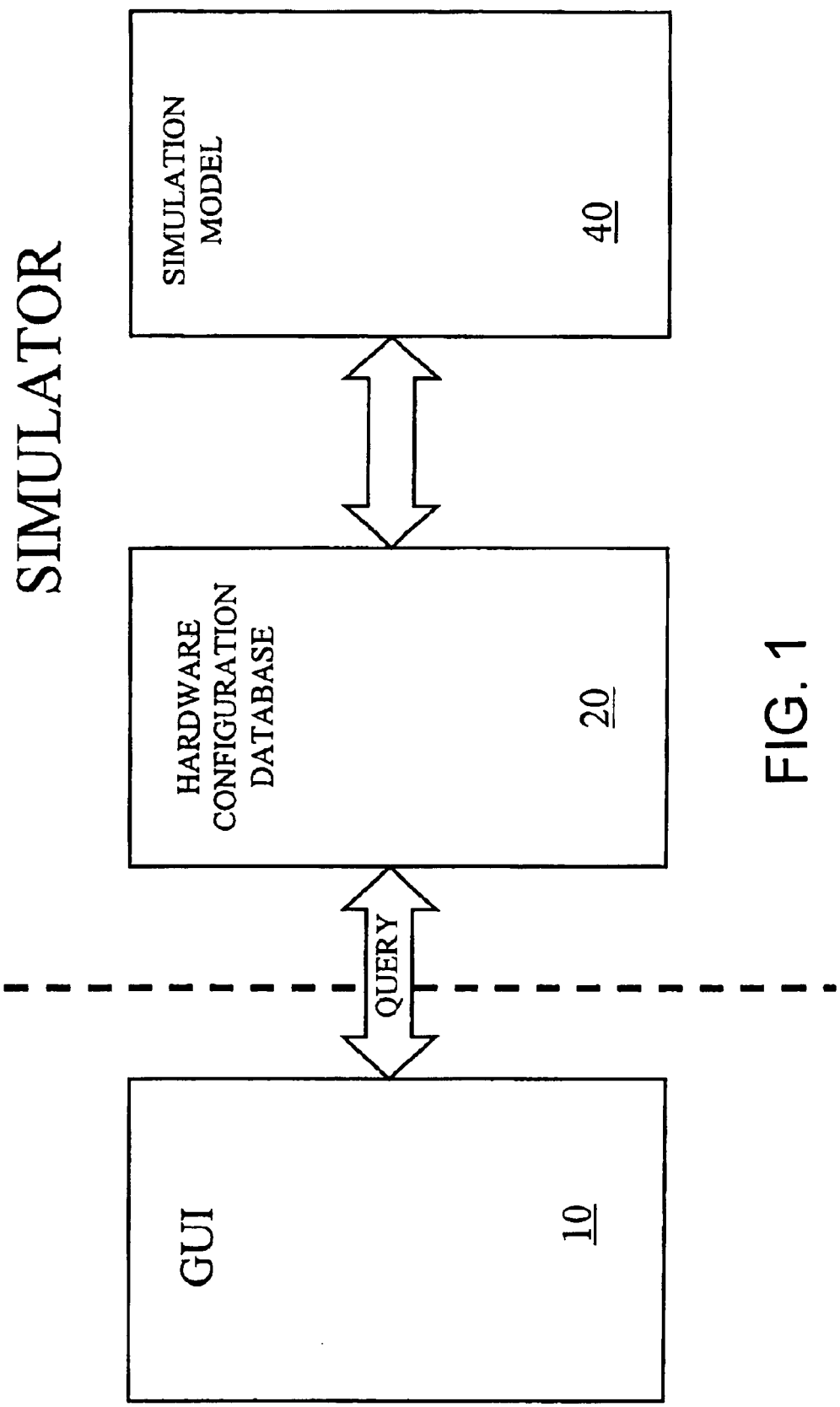
FIG. 1 illustrates a hardware configuration database interface between a GUI and a processor chip simulation model.

FIG. 1 illustrates a system that includes a processor integrated circuit (chip) simulator model 40 and a graphical user interface (GUI) 10. An intermediate hardware configuration description database 20 provides the GUI 10 with processor chip hierarchy and connectivity information. The database 20 uses a configuration language that can be interpreted by GUI 10. Using the language, the user describes a design configuration for the processor chip simulation model 40 to GUI 10.

Once the design configuration is described, the design implementation can be queried through the GUI 10. A "query" is a request for information. A query instituted through the GUI may include requests for information on processor chip simulation model 40 such as contents of a memory location, status of a register, or other information desired as a processor chip design aid.

Figure 2:
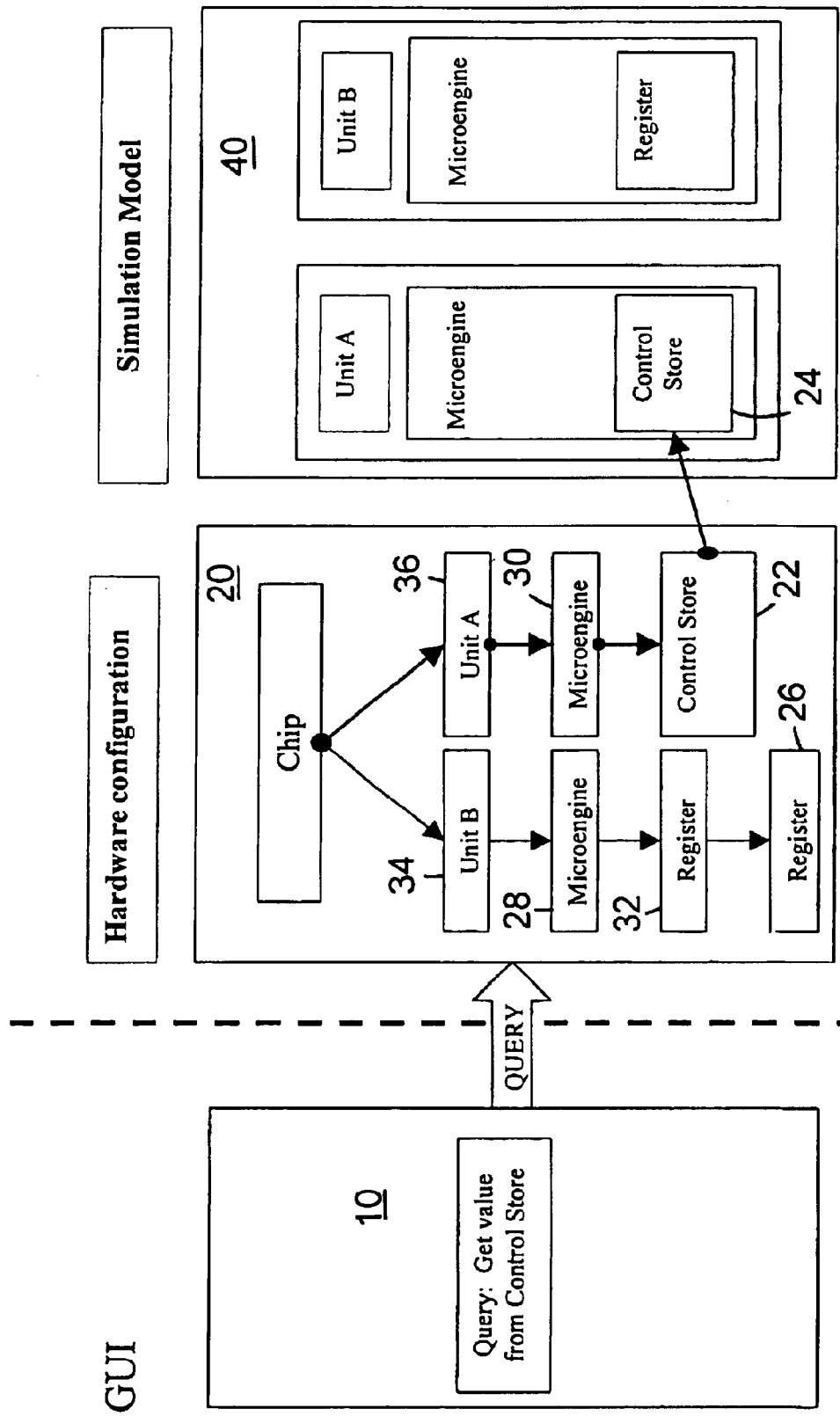
FIG. 2 illustrates an example of hierarchical levels in the hardware configuration.

Referring to FIG. 2, the hardware configuration database 20 includes the location of hardware devices such as registers, microengines, etc. The hardware devices represent functional building blocks and sub-blocks of a processor chip design. Through use of the GUI 10 and the hardware configuration database, a user can search through the interconnections of devices to find the devices of interest.

The configuration language enables the user to provide a description of the processor simulation model 40 to GUI 10 in terms of the functional building blocks. The functional building blocks can include, but are not limited to, memories 26, control stores 22, microengines 28, 30 and registers 32.

The hardware configuration database 20 allows users to move the location of the functional blocks and subcomponents of hardware inside the simulation model 40 without requiring changes to the GUI. A query of the GUI software enables a searche for the functional blocks and subcomponents in the hardware configuration database 20 until the particular items in the simulation model 40 are located. Once located, the GUI 10 can be used to inject and examine states of components in the simulation model 40 without requiring a hard-coded path to those simulation entities.

A user can specify connectivity of units by coupling the functional building blocks using the hardware configuration language to form higher-level groupings. The user configures one or more of these higher-level groupings into a yet higher-level component. The integrated circuit design is, thus, simulated by hierarchical levels of subcomponents. Multiple hierarchical levels may be described. The connectivity between the levels and components also can be described using the hardware configuration language. The top level of the configuration hierarchy is the GUI simulation connection.

A particular implementation uses a single hierarchical level that includes a first unit 36 and a second unit 34 as illustrated in FIG. 2. Assume, for example, that GUI 10 requires information about a control store 22. Querying the hardware configuration database 20 for control store 22 allows GUI 10 to locate control store 24 in the simulation model 40. Once the control store 24 is located, the GUI 10 can be used to operate on the control store 24 directly, without assistance from the hardware configuration database 20.

Figure 3:
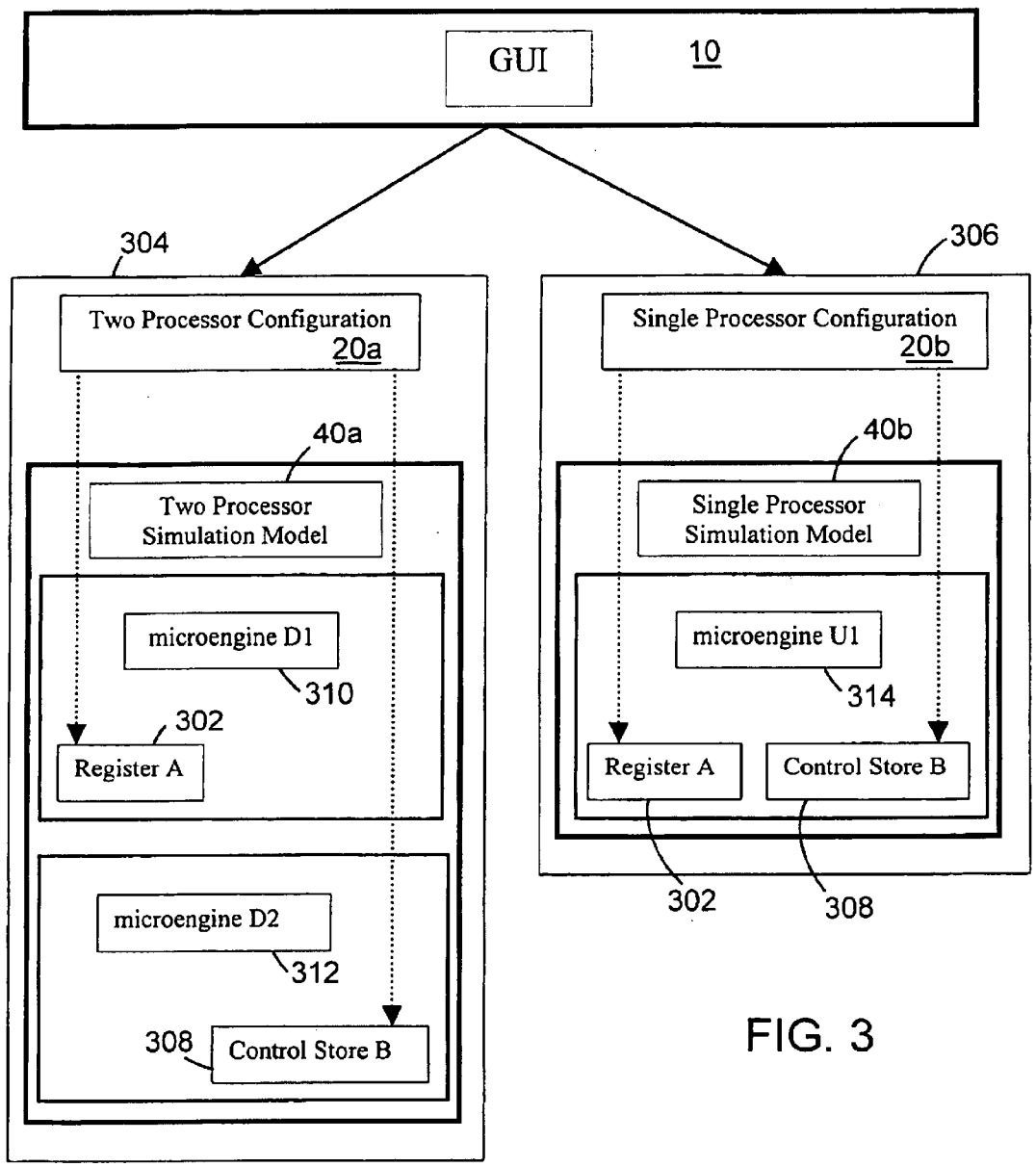
FIG. 3 illustrates a GUI access to a particular hardware component in either a single- or dual-processor simulation model.

FIG. 3 illustrates that GUI 10 need not be dependent on the particular simulation processor design. In this example, GUI 10 accesses two different simulation models, 40a and 40b, through hardware design databases 20a and 20b, respectively.

Simulation model 40b is a single-processor model, and the simulation model 40a is a dual-processor model. Simulation model 40a has two microengines 310 and 312 in which register 302 is associated with microengine 310 and control store 308 is associated with microengine 312. Simulation model 40b has one microengine 314 with which both register 302 and control store 308 are associated.

The GUI 10 can find the location of register 302 and control store 308 whether the simulation is accomplished in the single-processor simulation model 40b or dual-processor simulation model 40a by implementing either the hardware configuration database 306 or 304, respectively.

The GUI needs little or no information on the simulation model stored internally to the GUI. This hardware independence indicates that the GUI 10 is less affected by hardware changes to the simulation model. Also, the same GUI software may be used to interface to multiple processor designs because the specific details of each processor design are in the hardware configuration description database, not in the GUI software.

Specific simulation data can be located by the GUI 10 in the simulation model 40 without requiring hardware specific information to be contained in the GUI. The GUI uses the hardware configuration database 20 to search the simulation model 40 and locate simulation components that can be specified in the hardware configuration database. Once located, these components may be operated on to, for example, read and/or write simulation state information, or provide electrical stimulus and/or monitor responses in those simulation components. For example the GUI can locate control store 308 in either the single- or dual-processor simulation models. Once control store 308 is located, the GUI may access and read the data in the control store or write new data to the control store. The GUI does not need to hard-code information specifying that control store 308 is in microengine 310 in the dual-processor configuration and microengine 314 in the single-processor configuration.

The GUI is 10 useable in connection with different processor configurations. Later processor design efforts may use the same GUI with little or no change in the hardware configuration of the GUI. Also, the reusability of the GUI software means that the GUI requires less rework for each hardware design implementation or modification.

Referring to FIGS. 4A and 4B, the macros DEF_CLK, DEF_REG and DEF_ARRAY define a binding of the hierarchical path to a variable name for the single- and dual-processor simulation models, respectively. The variable name ustore defines the path to control store 308 which is in microengine 312 of the double-processor simulation model 40a and in microengine 314 of the single-processor simulation model 40b. Once the variable name is defined, a movement of the physical location of the control store, for example, only requires a change of the macro DEF_ARRAY to point to the new physical location in the simulation model. Both the single- and dual-processor hardware configurations can use the same variable to describe the control store location, but each sets the variable to point to the location for its particular configuration.

FIG. 5 illustrates, in a particular example, C++ code for the hardware configuration database which will map the control store and register to the GUI. In this example, the code creates a top-level block, chip, and connects chip to a subblock, useq. The useq block is associated with two blocks: the control store and the register. The GUI 10 can locate the control store 308 in this hierarchy of blocks or it can ask for control store 308 using the previously defined label, ustore. The hardware configuration database 20 then can ask for the control store 308 using the name ustore and the simulator model can locate the control store 308 block which is 314.ram_ustore for the single-processor and 312.ram_ustore for the dual-processor case.

FIG. 6 illustrates, in a particular example, C++ code in the GUI that asks for the control store 308 and the register 302. In this example, the GUI is requesting specific names which were defined earlier. Other calls can find all registers that are contained in the hardware configuration database. The call illustrated, returns a handle to the register or control store specifically requested by the GUI.

Various features of the system can be implemented in a computer-implemented process and an apparatus for practicing the process. Some or all of the features of the system also can be implemented in computer program code containing instructions embodied in tangible media, such as floppy diskettes, CD-ROMs, hard drives, or any other computer-readable storage medium. The computer program code can be loaded into and executed by a computer. The various features can also be embodied in computer program code, for example, whether stored in a storage medium, loaded into and/or executed by a computer, or transmitted over a transmission medium, such as over electrical wiring or cabling, through fiber optics, or by electromagnetic radiation. When implemented on a general-purpose microprocessor, the computer program code segments configure the microprocessor to create specific logic circuits.

Other implementations are within the scope of the following claims.

What is claimed is:

1. A method for testing a simulation model via a graphical user interface (GUI) using a hardware-configuration database interfaced to the simulation model and to the GUI, the method comprising:
    sending a query from the GUI to the hardware-configuration database, the query requesting information associated with a hardware device simulated by the simulation model, the hardware-configuration database including a location of the hardware device within the simulation model, the hardware device comprising functional blocks;
    receiving the location of the hardware device at the GUI from the hardware-configuration database;
    sending commands from the GUI to the hardware device in the simulation model; and
    accessing functional-block information of the hardware device located in the simulation model using the GUI, the functional-block information being affected by the commands sent to the hardware device by the GUI.

2. The method of claim 1, wherein the functional blocks represent a chip design.

3. The method of claim 2, wherein the chip design represents a processor chip.

4. The method of claim 1, further comprising combining the functional blocks into first level hierarchical relationships.

5. The method of claim 4, further comprising combining the first level hierarchical relationships into second level hierarchical relationships.

6. The method of claim 5, further comprising repeatedly combining the first level hierarchical relationships until a chip design is described.

7. The method of claim 1, wherein the simulation model is a first simulation model and the method further comprises changing hardware descriptions stored in the hardware-configuration database to form a second simulation model.

8. The method of claim 1, wherein the query includes requests for information on a processor chip design.

9. An apparatus for testing a simulation model via a graphical user interface (GUI) using a hardware-configuration database interfaced to the simulation model and to the GUI, the apparatus comprising circuitry to:
    send a query from the GUI to the hardware-configuration database, the query requesting information associated with a hardware device simulated by the simulation model, the hardware-configuration database including a location of the hardware device within the simulation model, the hardware device comprising functional blocks;
    receive the location of the hardware device at the GUI from the hardware-configuration database;
    send commands from the GUI to the hardware device in the simulation model; and
    access functional-block information of the hardware device located in the simulation model using the GUI, the functional-block information being affected by the commands sent to the hardware device by the GUI.

10. The apparatus of claim 9, wherein the functional blocks represent a chip design.

11. The apparatus of claim 10, wherein the chip design represents a processor chip.

12. The apparatus of claim 9, further comprising circuitry to combine the functional blocks into first level hierarchical relationships.

13. The apparatus of claim 12, further comprising circuitry to combine the first level hierarchical relationships into second level hierarchical relationships.

14. The apparatus of claim 13, further comprising circuitry to combine repeatedly the first level hierarchical relationships until a chip design is described.

15. The apparatus of claim 9, wherein the simulation model is a first simulation model and the apparatus further comprises circuitry to change the hardware descriptions stored in the database to form a second simulation model.

16. The apparatus of claim 9, wherein the query includes requests for information on a processor chip design.

17. An article comprising a machine-readable medium that stores executable instructions for testing a simulation model via a graphical user interface (GUI) using a hardware-configuration database interfaced to the simulation model and to the GUI, the instructions causing a machine to:

send a query from the GUI to the hardware-configuration database, the query requesting information associated with a hardware device simulated by the simulation model, the hardware-configuration database including a location of the hardware device within the simulation model, the hardware device comprising functional blocks;

receive the location of the hardware device at the GUI from the hardware-configuration database;

send commands from the GUI to the hardware device in the simulation model; and access functional-block information of the hardware device located in the simulation model using the GUI, the functional-block information being affected by the commands sent to the hardware device by the GUI.

18. The article of claim 17, wherein the functional blocks represent a chip design.

19. The article of claim 18, wherein the chip design represents a processor chip.

20. The article of claim 17, wherein the medium further comprises instructions causing a machine to combine the functional blocks into first level hierarchical relationships.

21. The article of claim 20, wherein the medium further comprises instructions causing a machine to combine the first level hierarchical relationships into second level hierarchical relationships.

22. The article of claim 21, wherein the medium further comprises instructions causing a machine to combine repeatedly the first level hierarchical relationships until a chip design is described.

23. The article of claim 17, wherein the simulation model is a first simulation model and the medium further comprises instructions causing a machine to change hardware descriptions stored in the hardware-configuration database to form a second simulation model.

24. The article of claim 17, wherein the query includes requests for information on a processor chip design.

* * * * *